(12) United States Patent
Yamaguchi et al.

(10) Patent No.: US 7,468,645 B2
(45) Date of Patent: Dec. 23, 2008

(54) SIGNAL LINE CIRCUIT DEVICE

(75) Inventors: Takeshi Yamaguchi, Gunma (JP); Toshikazu Imaoka, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/045,936

(22) Filed: Jan. 28, 2005

(65) Prior Publication Data

US 2005/0168304 A1   Aug. 4, 2005

(30) Foreign Application Priority Data

Jan. 29, 2004  (JP)  ............... 2004-022203
Mar. 10, 2004  (JP)  ............... 2004-068014

(51) Int. Cl.
  *H01P 3/08*  (2006.01)
(52) U.S. Cl. ...................... 333/238; 333/246
(58) Field of Classification Search ............. 333/238, 333/246, 247
  See application file for complete search history.

(56) References Cited

U.S. PATENT DOCUMENTS

| 5,293,301 | A | * | 3/1994 | Tanaka et al. ............... 361/707 |
| 5,510,758 | A | * | 4/1996 | Fujita et al. ................ 333/247 |
| 5,634,208 | A | * | 5/1997 | Nishikawa et al. .......... 455/327 |
| 5,751,060 | A | | 5/1998 | Laine et al. |
| 5,907,187 | A | | 5/1999 | Koiwa et al. |

FOREIGN PATENT DOCUMENTS

| JP | 06-224606 | 8/1994 |
| JP | 10-135634 | 5/1998 |
| JP | 2002-203924 | 7/2002 |

* cited by examiner

*Primary Examiner*—Stephen E Jones
(74) *Attorney, Agent, or Firm*—Fish & Richardson P.C.

(57) ABSTRACT

A signal line circuit device is disposed on top of a mounting substrate. The signal line circuit device comprises a dielectric layer, a signal line formed on one surface of the dielectric layer, and a spacer (formed from a solder or a photo solder resist), which is formed between the mounting substrate and the dielectric layer, and generates a space separation between the signal line and the mounting substrate.

4 Claims, 18 Drawing Sheets

TRIMMING

SIGNAL LINE CIRCUIT DEVICE

BACKGROUND OF THE INVENTION

1. Field of the Invention

The present invention relates to a signal line circuit device.

2. Description of the Related Art

Patent Reference 1 discloses a laminated resonator in which a line conductor is provided between layers of dielectric insulators, and a ground conductor is provided on the outer layer. A method of controlling the frequency of this type of laminated resonator by trimming the line conductor is already known.

However, conventionally the line conductor is covered with a layer of insulator, meaning that in order to trim the line conductor, the line conductor must first be exposed at one side surface of the laminated structure, which requires the entire side surface to be cut away.

FIGS. 14A and 14B are diagrams showing a conventional example, wherein a signal line is disposed on the surface of an insulator layer on which circuit elements are formed.

In this diagram, a signal line 6 is formed on the surface of a dielectric layer 4, and a ground line 8 is formed on the lower surface of the dielectric layer 4. Furthermore, although not shown in the diagram, circuit elements such as semiconductor elements and/or passive elements are disposed on the surface of the dielectric layer 4, and a molded resin 14 then covers these circuit elements.

In this conventional configuration, the signal line 6 is covered with the dielectric layer 4 and the molded resin 14, meaning that in order to trim the signal line 6, either the entire side surface of the device must be cut away, as indicated by the dashed line in FIG. 14A, or alternatively, a portion of the molded resin 14 must be removed as shown in FIG. 14B, thereby exposing the signal line 6 and enabling the trimming operation to be performed, and the removed molded resin 14 must then be replaced. If trimming of the signal line 6 is conducted using the method shown in FIG. 14A, a positional constraint arises in that the signal line 6 must be positioned close to the side surface to be trimmed. On the other hand, if trimming of the signal line 6 is conducted using the method shown in FIG. 14B, then in order to achieve the partial removal of the molded resin 14, a molding die that is capable of providing the required opening must be used, and following trimming, the opening must then be filled with molding resin, which makes this method costly and time-consuming.

3. Related Art List

Japanese Patent Laid-Open Publication No. Hei 6-224606

SUMMARY OF THE INVENTION

The present invention takes the circumstances described above into consideration, with an object of providing a technique that enables the signal line in a signal line circuit device to be trimmed easily, thus enabling adjustment of the device characteristics.

The present invention provides a signal line circuit device comprising a dielectric layer, a signal line formed on one surface of the dielectric layer, and a spacer which is provided on the same surface of the dielectric layer, and which, in a case where another member is also disposed on the same surface of the dielectric layer, ensures a space between the signal line and the member.

A ground line is provided on the opposite surface of the dielectric layer, or on both sides of the signal line. The signal line forms a pair with the ground line, generating a microstrip line or coplanar line. Because the signal line is provided on one surface of the dielectric layer, trimming of the signal line can be performed with ease. In this situation, the spacer is provided around the periphery of the region in which the signal line is formed. Furthermore, the other members may constitute a substrate.

If other members are positioned close to the signal line while the signal line is formed on the surface of the dielectric layer, then the characteristic impedance of the signal line is prone to fluctuations due to the effect of the neighboring members. This fluctuation of the characteristic impedance is particularly noticeable when the other members are conductive members. This is the reason that the signal line has conventionally not been positioned at the surface of the dielectric layer. However if, as in this aspect of the invention, a space is provided between the signal line and the other members, then the signal line is surrounded by air, which has a low dielectric constant, meaning the effect of the other members can be reduced considerably, enabling fluctuations in the characteristic impedance to be suppressed.

The signal line circuit device of the present invention may further comprise a circuit element disposed on the opposite surface of the dielectric layer to the one surface thereof, and a sealing resin which seals the circuit element on the opposite surface of the dielectric layer.

In the present invention, even if such a circuit element and a sealing resin are provided on the dielectric layer, because the signal line is provided on the opposite surface to the surface on which the sealing resin and the like are disposed, trimming of the signal line can still be performed with ease.

The present invention also provides a signal line circuit device comprising a substrate, a conductive member formed on a surface of the substrate, a dielectric layer disposed on top of the substrate, a signal line formed on one surface of the dielectric layer, and a spacer which is provided between the substrate and the dielectric layer, and ensures a space between the signal line and the substrate.

If a substrate with a conductive member formed thereon is positioned close to the signal line, then the characteristic impedance of the signal line is prone to fluctuations, due to the effect of the conductive member. However in this aspect of the present invention, because a spacer is disposed between the signal line and the substrate, the effect of the substrate can be reduced considerably, enabling fluctuations in the characteristic impedance to be suppressed.

The conductive member may be formed either on the surface of the substrate that faces the signal line, or on the opposite surface. Forming the conductive member on the opposite surface of the substrate means it can be separated even further from the signal line, thus enabling the effect of the conductive member to be further reduced.

In the signal line circuit device of the present invention, the spacer may be formed with a greater thickness than the film thickness of the signal line. The signal line may then be embedded into the surface of the dielectric layer, or a portion, or the entirety, of the signal line may protrude from the dielectric layer surface. By adopting such a construction, a space can be maintained between the signal line and the other members or the substrate, regardless of the positioning of the signal line. This can reduce the effect of these other members on the signal line. The greater the distance between the signal line and the other members or the substrate, the more effectively any effects from these other members can be suppressed.

In the signal line circuit device of the present invention, the signal line can be formed so that the opposite surface of the signal line to the surface which contacts the dielectric layer is exposed.

In the signal line circuit device of the present invention, the signal line can be covered with an insulating material with a lower dielectric constant than the material of the dielectric layer.

This enables the electromagnetic field generated by the signal line to be confined within the insulating material.

While the structure of the present invention has been described above, it should be noted that combinations of different aspects of the above structures also fall within the scope of the present invention. Furthermore, rewordings of the above expressions to suit different categories also fall within the scope of the present invention.

DETAILED DESCRIPTION OF THE INVENTION

FIRST EMBODIMENT

Figure 1:
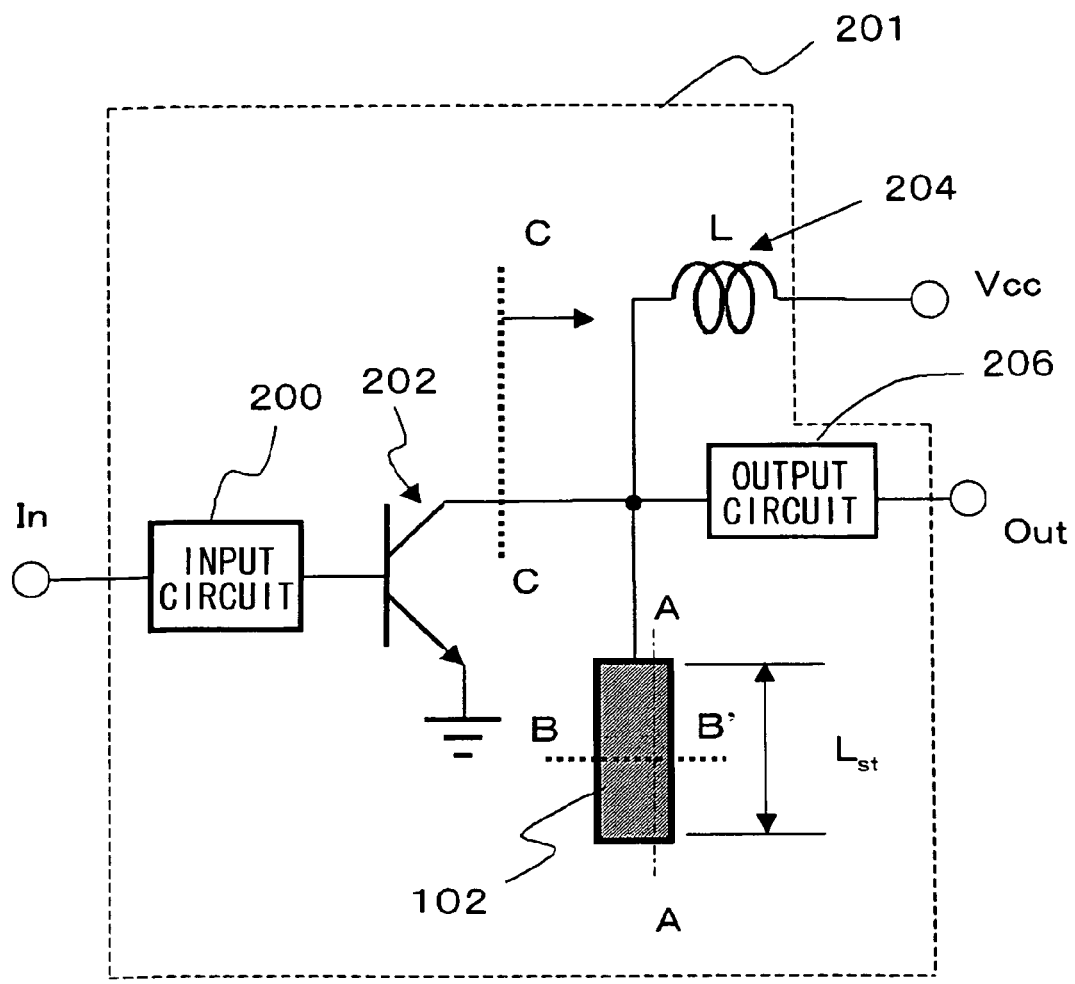
FIG. 1 is a diagram showing the layout of the peripheral circuits when a signal line circuit device according to a first embodiment of the present invention is used as one component of an amplifier.

FIG. 1 is a diagram showing the layout of the peripheral circuits when a signal line circuit device according to a first embodiment of the present invention is used as one component of an amplifier.

In the diagram, the amplifier 201 comprises an input circuit 200, a transistor 202, a coil 204, a signal line circuit device 102, and an output circuit 206. The input circuit 200 is connected to the base of the transistor 202, and the output circuit 206 is connected to the collector. Furthermore, the coil 204 and the signal line circuit device 102 are also connected to the collector of the transistor 202. The emitter of the transistor 202 is grounded. A detailed description of the signal line circuit device 102 is presented below, but in brief, the signal line circuit device 102 is a microstrip line comprising a signal line and a ground line. The characteristics of the amplifier 201 fluctuate depending on the characteristics of the transistor 202 and the coil 204, but by adjusting the length of the signal line within the signal line circuit device 102, these fluctuations in the characteristics of the amplifier 201 can be reduced.

This was verified by setting the design value for the inductance of the coil 204 to 3.3 nH, and determining the reflection characteristics, as viewed from the line C-C' in FIG. 1, on the assumption of a margin of error in the inductance of 58 0.5 nH. The length $L_{st}$ of the signal line was fixed, and when the inductance value of the coil 204 was set to values of 2.8 nH and 3.8 nH, the simulated results for the reflection characteristics were significantly removed from the design value. However, by appropriate adjustment of the length $L_{st}$ of the signal line within the signal line circuit device 102, the reflection characteristics could be matched to the design value, meaning the characteristics of the amplifier 201 could be adjusted to match the design value.

Figure 2:
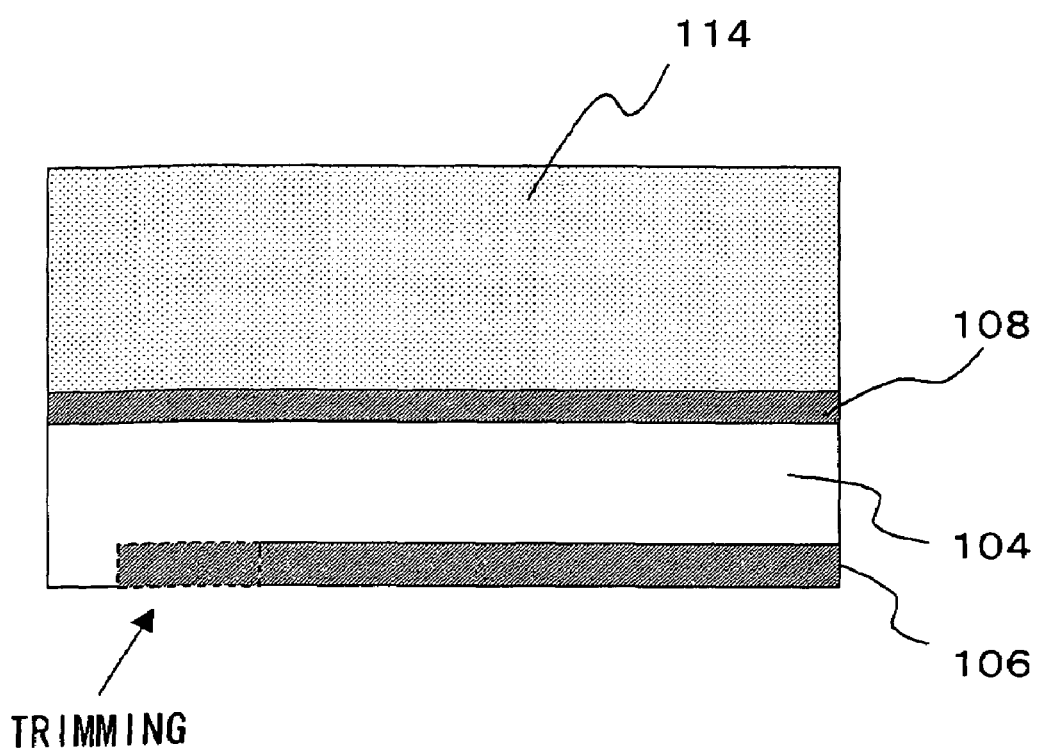
FIG. 2 is a cross-sectional view taken along the line A-A'0 in FIG. 1.
Figure 3:
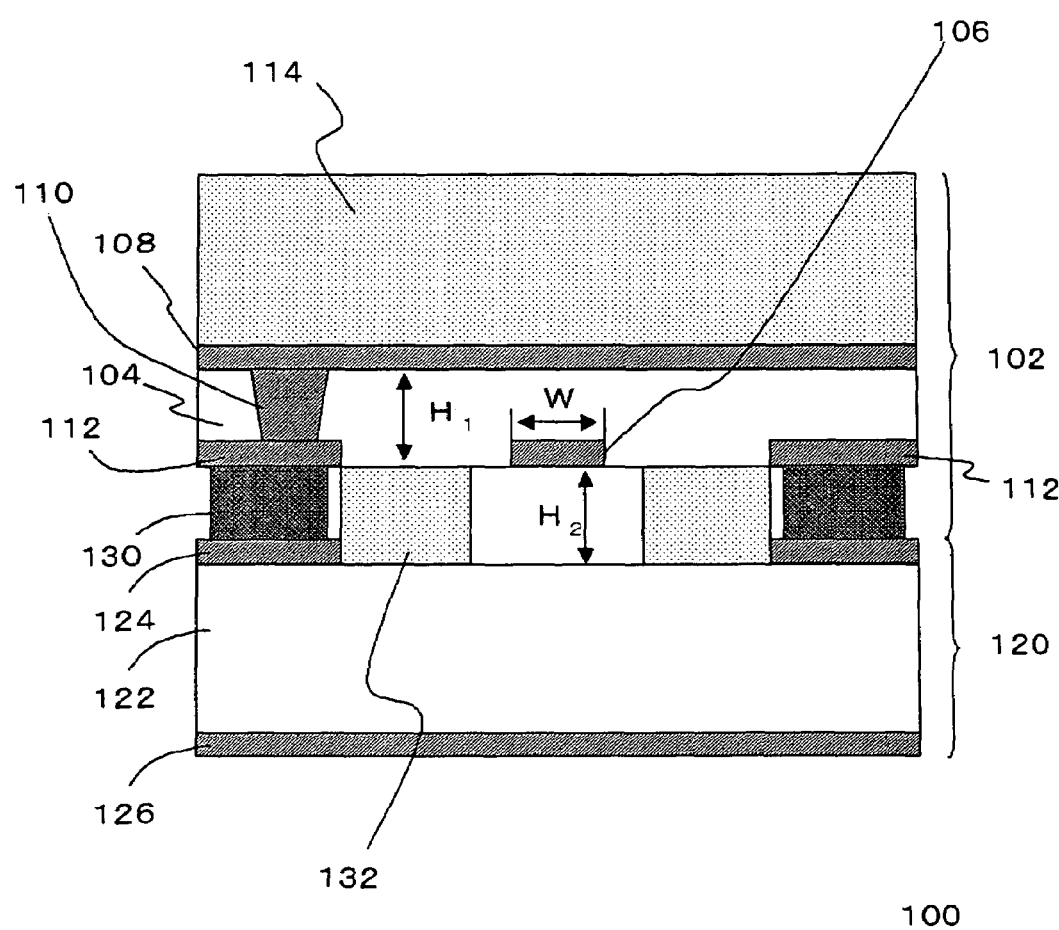
FIG. 3 is a cross-sectional view taken along the line B-B' in FIG. 1.

As follows is a detailed description of the microstrip line of the signal line circuit device 102. FIG. 2 and FIG. 3 are cross-sectional views of the signal line circuit device shown in FIG. 1. FIG. 2 represents a cross-sectional view taken along the line A-A' in FIG. 1, and FIG. 3 represents a cross-sectional view taken along the line B-B' in FIG. 1.

As shown in FIG. 2, the signal line circuit device 102 comprises a dielectric layer 104, a ground line 108 formed on one surface of the dielectric layer 104, and a signal line 106 formed on the opposite surface of the dielectric layer 104. The signal line 106 is a strip conductor which forms a pair with the ground line 108, thus generating a microstrip line. The dielectric layer 104 is a substrate formed from a material such as FR-4. The material used for forming the dielectric layer 104 is described in more detail below.

Although not shown in the diagrams, circuit elements such as semiconductor elements or passive elements are disposed on the surface of the dielectric layer 104. Examples of possible semiconductor elements include transistors, diodes, and IC chips, whereas examples of possible passive elements include chip capacitors and chip resistors. Furthermore, although not shown in the diagrams, a wiring pattern is formed on top of the dielectric layer 104, and is connected electrically to the circuit elements. A molded resin 114 for sealing the circuit elements is provided on top of the dielectric layer 104.

FIG. 3 shows the signal line circuit device 102 mounted on top of a mounting substrate 120. As shown in FIG. 3, a photo solder resist 132, and an external electrode 112, which is positioned on both sides outside the resist, are formed on the lower surface of the dielectric layer 104. One end of the ground line 108 (the left end in the diagram) and the external electrode 112 are connected together electrically by a via 110.

Ground lines 124 and 126 are provided on the upper and lower surfaces respectively of the mounting substrate 120. The external electrode 112 of the signal line circuit device 102 and the ground line 124 of the mounting substrate 120 are connected together via a solder joint 130.

In this construction, the solder joint 130 and the photo solder resist 132 function as spacers for ensuring an adequate space is maintained between the signal line 106 of the signal line circuit device 102 and the mounting substrate 120. This enables a space of height $H_2$ to be provided between the signal line 106 of the signal line circuit device 102 and the mounting substrate 120. By incorporating a material with a low dielectric constant such as air in the space between the signal line 106 and the mounting substrate 120, the effect of the ground lines 124 and 126 formed on the surfaces of the insulator layer 122 can be reduced, thus enabling fluctuations in the characteristic impedance of the microstrip line to be suppressed.

As described above, the characteristics of the amplifier 201 (FIG. 1) can be adjusted by trimming the end of the signal line 106 to alter the length of the signal line 106. Trimming is performed prior to the mounting of the signal line circuit device 102 on top of the mounting substrate 120. This trimming of the signal line 106 can be performed by laser irradiation or the like. The end of the signal line 106 following trimming can be coated with a resin or the like. This helps prevent corrosion and the like of the signal line 106. As shown in FIG. 2, the signal line 106 is formed on the outside of the signal line circuit device 102 in this embodiment, meaning trimming can be performed with ease.

Figure 13:
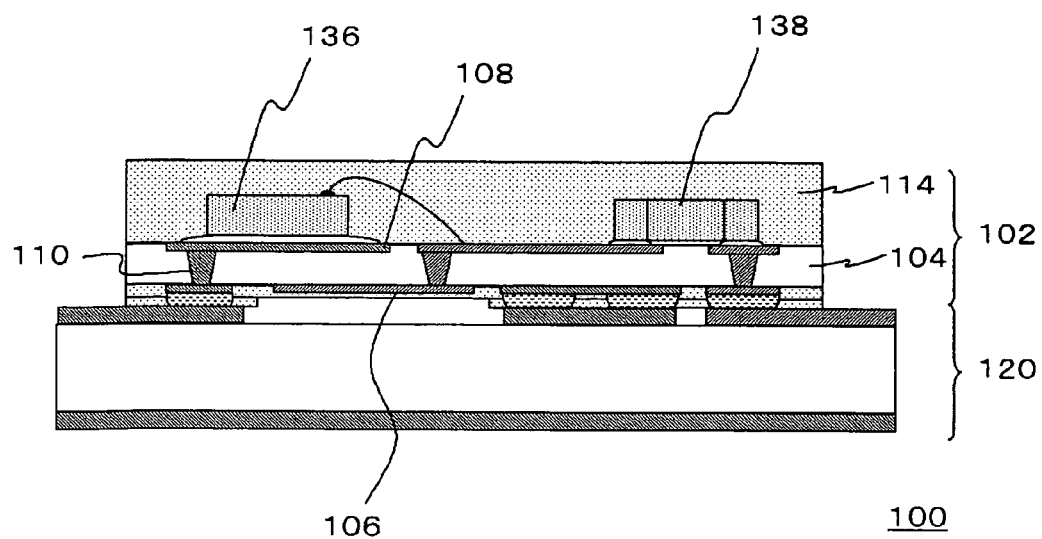
FIG. 13 is a cross-sectional view showing the structure of a mounted device according to the first embodiment of the present invention.
Figure 14A:
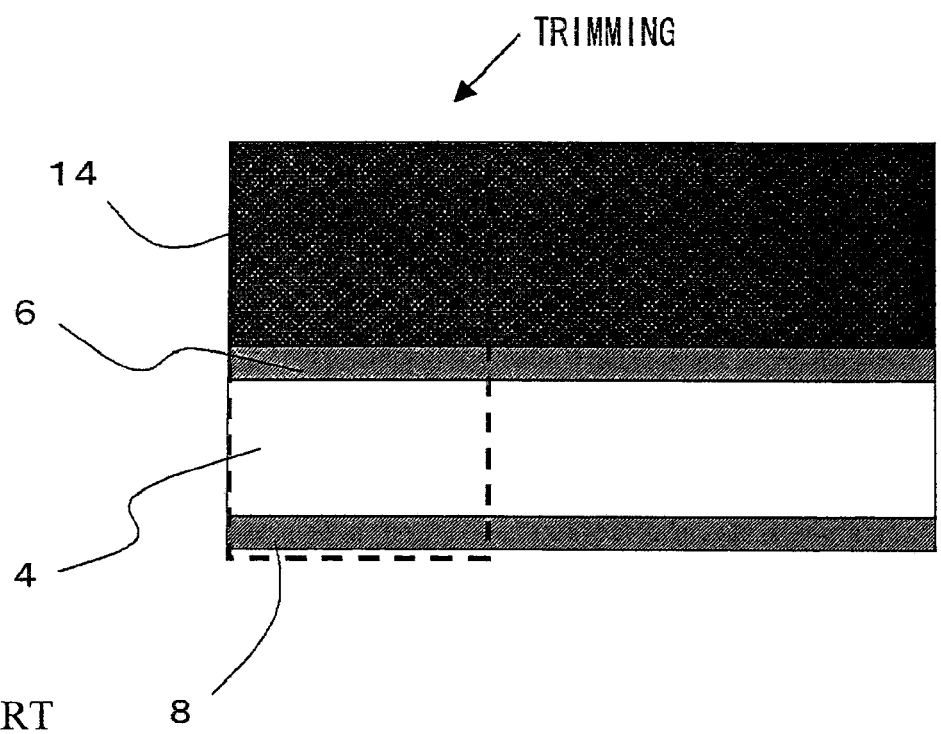
FIGS. 14A and 14B are cross-sectional views showing the structures of conventional signal line circuit devices.
Figure 14B:
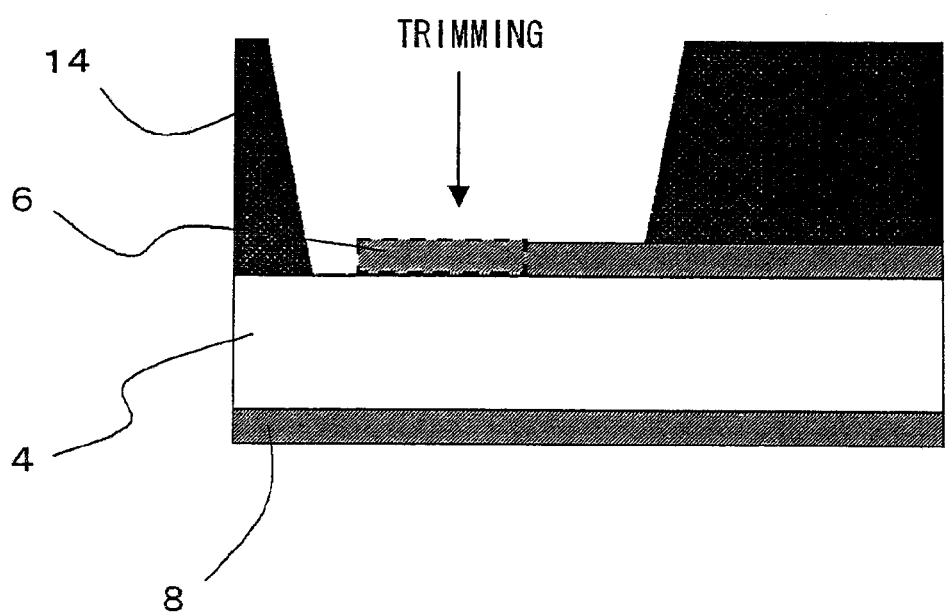

FIG. 13 shows the overall structure of the mounted device 100. In this diagram, circuit elements such as a semiconductor element 136 and a passive element 138 are disposed on top of the dielectric layer 104. In the structure shown, the microstrip line comprises the ground line 108 formed on the lower surface of the semiconductor element 136, and the signal line 106 formed below the ground line 108 with the dielectric layer 104 disposed therebetween.

Figure 4A:
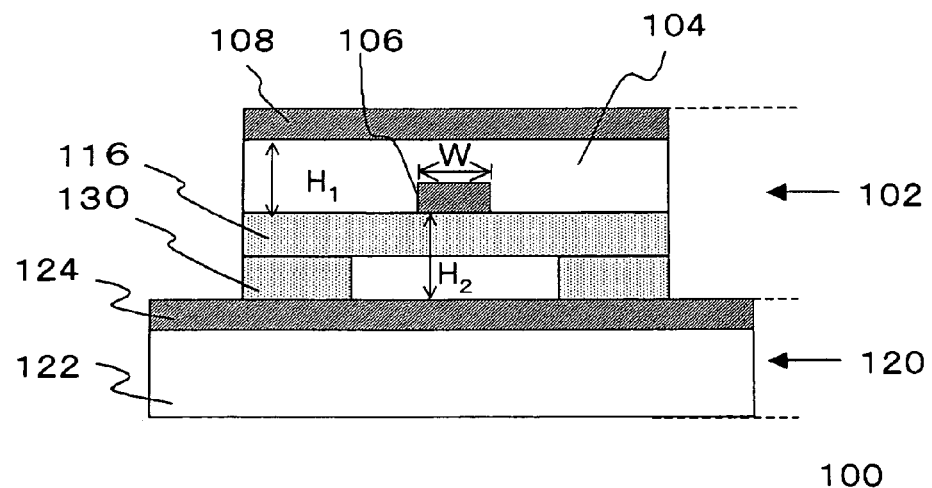
FIGS. 4A and 4B are diagrams showing the structure of a mounted device, wherein a signal line circuit device is disposed on top of a mounting substrate.

Next is a description of the results of measuring the relationship between the thickness $H_1$ of the dielectric layer 104, the distance $H_2$ between the signal line 106 and the insulator layer 122, and the characteristic impedance of the signal line circuit device 102, for the case where the signal line circuit device 102 is mounted on top of the mounting substrate 120. The characteristic impedance of the signal line circuit device 102 was measured for the case shown in FIG. 4A, where a ground line 124 was provided on the upper surface of the insulator layer 122 of the mounting substrate 120, and for the case shown in FIG. 4B, where a ground line 126 was provided on the lower surface of the insulator layer 122.

The characteristic impedance of the microstrip line is determined by the ratio between the width W of the signal line 106 and the thickness $H_1$ of the dielectric layer 104. In other words, as the thickness of the dielectric layer 104 is reduced, the width W of the signal line 106 can be narrowed. This means that even in those cases where the signal line circuit device 102 is mounted on top of a mounting substrate 120, the effect of the mounting substrate 120 can still be effectively reduced.

In this embodiment, measurements were conducted using a signal line circuit device 102 in which the signal line 106 was coated with a photo solder resist 116, as shown in FIG. 4. The relative dielectric constant of the dielectric layer 104 Was 4.4, and for layer thickness values $H_1$ of 50 μm, 100 μm, 150 μm, and 300 μm, the width W of the signal line 106 was set To 70 μm, 165 μm, 260 μm, and 550 μm respectively, producing a characteristic impedance of 50 Ω in each case. The insulator layer 122 of the mounting substrate 120 was formed from FR-4, and the thickness of the layer was approximately 500 μm. Each signal line circuit device 102 was mounted on a mounting substrate 120, and the characteristic impedance was measured. The results of the measurements are shown in FIG. 5.

Figure 5:
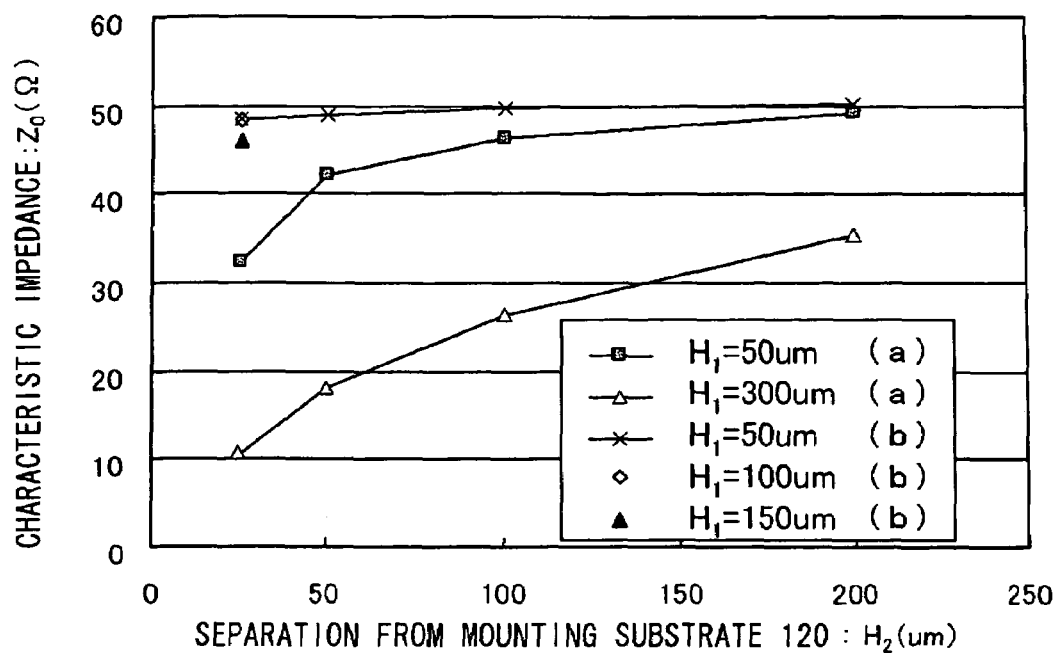
FIG. 5 is a graph showing the relationship between the thickness of the insulator layer, the separation distance between the signal line and the mounting substrate, and the characteristic impedance of the signal line circuit device, for the mounted device shown in FIG. 4.

As shown in FIG. 5, in the case where the ground line 124 was provided on the upper surface of the insulator layer 122 (the case shown in FIG. 4A), the effect of the mounting substrate 120 was able to be better reduced for larger separation distances $H_2$ between the signal line 106 and the mounting substrate 120, thus enabling better suppression of fluctuations in the characteristic impedance. Furthermore, the thinner the thickness $H_1$ of the dielectric layer 104 was, the narrower the width W of the signal line 106 could be made, thus enabling a reduction in the effect of the mounting substrate 120, and better suppression of fluctuations in the characteristic impedance. When the thickness $H_1$ of the dielectric layer 104 was set to 50 μm or less, fluctuations in the characteristic impedance were able to be largely prevented.

In the case where the ground line 126 was provided on the lower surface of the insulator layer 122 (the case shown in FIG. 4B), the effect of the mounting substrate 120 was almost non-existent, regardless of the size of the layer thickness $H_1$, and the fluctuation in the characteristic impedance was able to be suppressed to no more than 5%. Furthermore, even if the thickness and the dielectric constant of the insulator layer 122 were changed, there was still almost no effect on the characteristic impedance. If the fluctuation in the characteristic impedance was suppressed to no more than 5%, then any effect on the characteristics of the amplifier 201 shown in FIG. 1 was negligible.

Figure 4B:
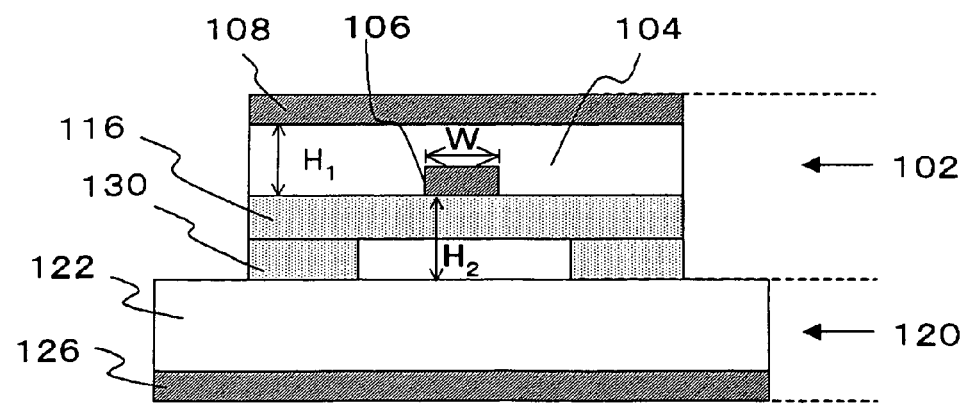

When a signal line circuit device 102 in which the thickness $H_1$ of the dielectric layer 104 was 50 μm was mounted onto a mounting substrate 120 with the structure shown in FIG. 4B, and the space $H_2$ between the signal line 106 and the insulator layer 122 was set to approximately 25 μm, almost no fluctuation in the characteristic impedance was observed.

From the above results it is clear that the thickness $H_1$ of the dielectric layer 104 should preferably be set to no more than 50 μm. This type of reduced thickness means that the effect of the mounting substrate 120 can be substantially reduced, regardless of whether the ground line is provided on the upper surface or the lower surface of the insulator layer 122. This, in turn, means that fluctuations in the characteristic impedance of the signal line circuit device 102 can be largely suppressed.

FIG. 6A through FIG. 8B are diagrams showing a variety of different structures for the signal line circuit device 102.

Figure 6A:
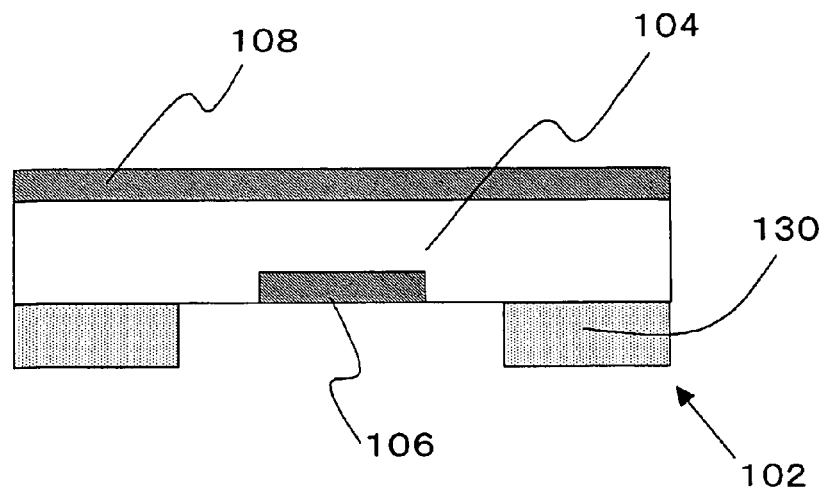
FIGS. 6A and 6B are diagrams showing different structures for the signal line circuit device.
Figure 6B:
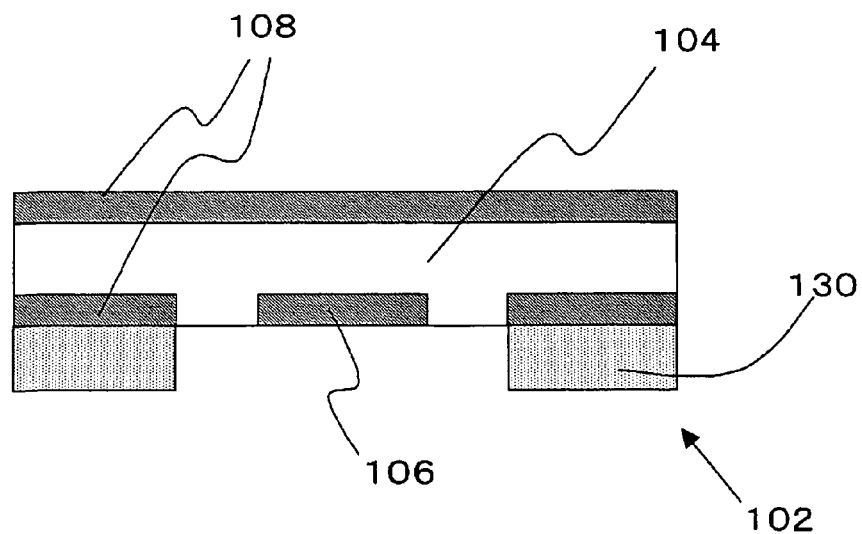
Figure 7A:
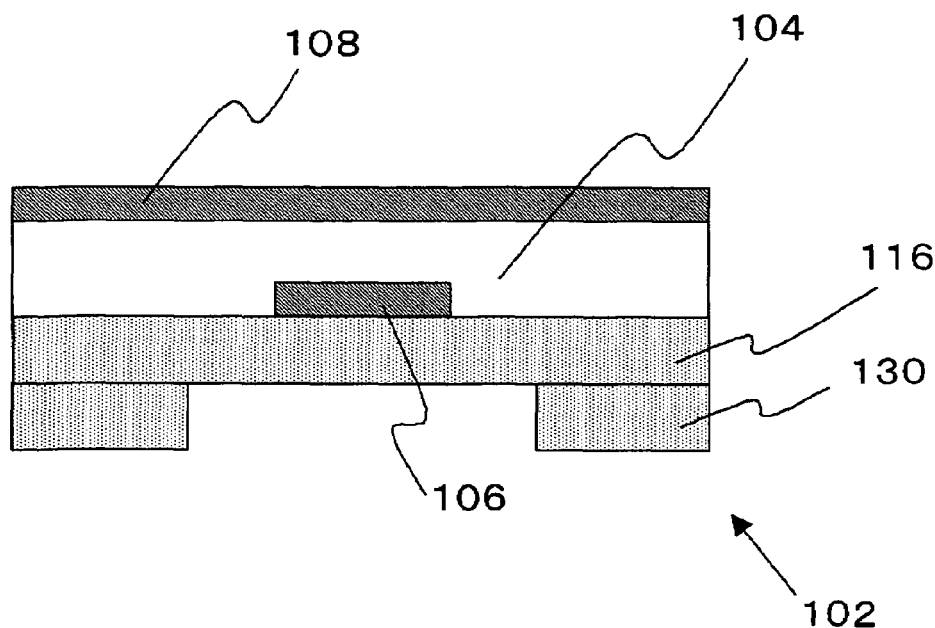
FIGS. 7A and 7B are diagrams showing different structures for the signal line circuit device.
Figure 7B:
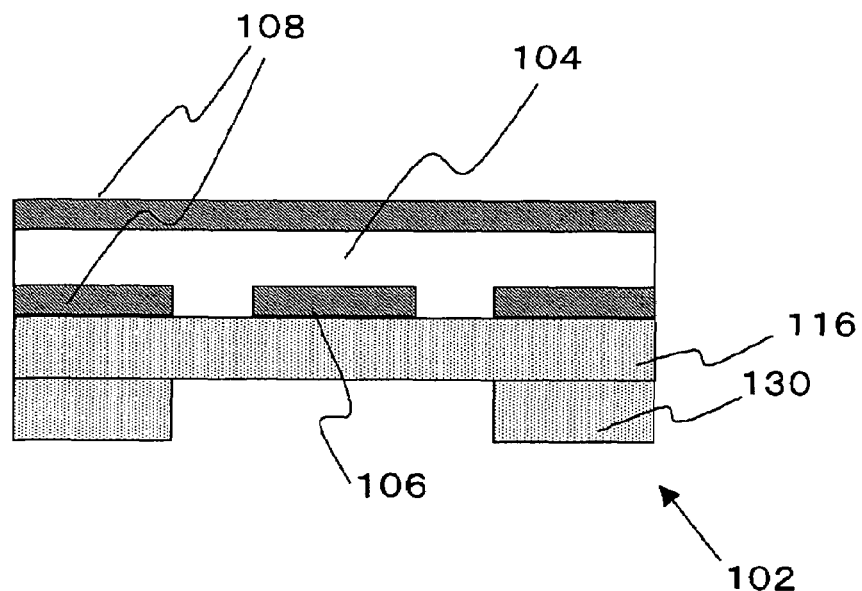
Figure 8A:
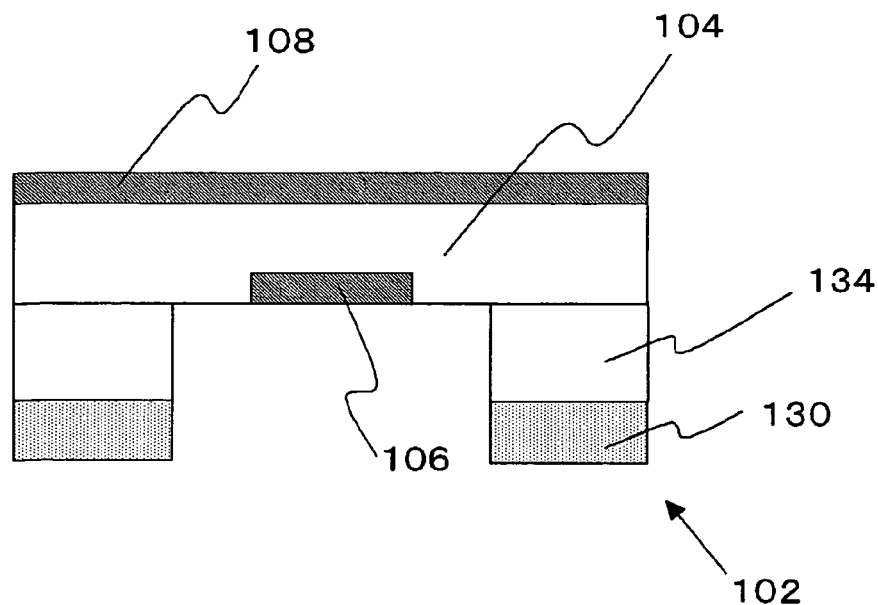
FIGS. 8A and 8B are diagrams showing different structures for the signal line circuit device.
Figure 8B:
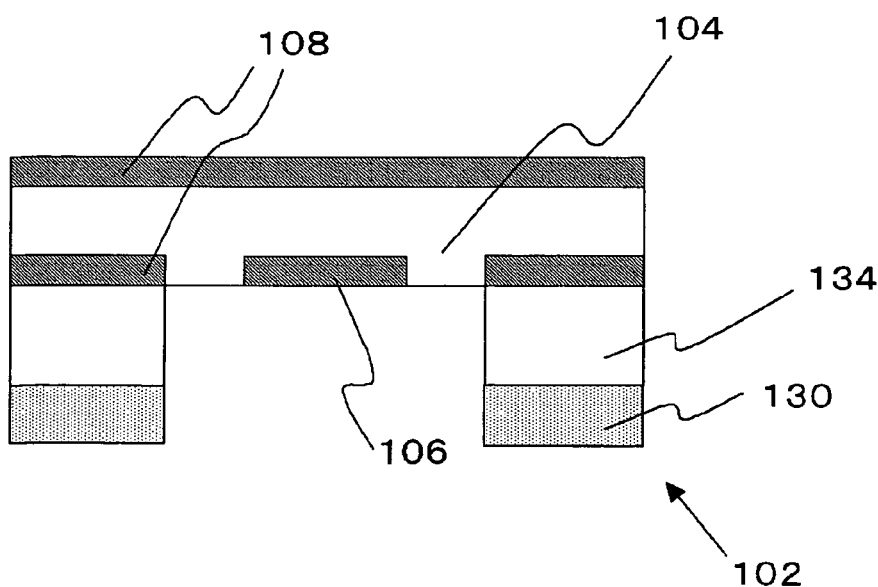

FIG. 6A, FIG. 7A, and FIG. 8A show microstrip line type signal line circuit devices 102. FIG. 6B, FIG. 7B, and FIG. 8B show coplanar type signal line circuit devices 102.

In FIG. 6A and FIG. 6B, a space is provided beneath the signal line 106. This means that when the signal line circuit device 102 is positioned on top of a mounting substrate 120 (see FIG. 3), the space between the signal line 106 and the mounting substrate 120 is filled with air, which has a low dielectric constant, meaning the signal line circuit device 102 is unaffected by the mounting substrate 120, enabling fluctuations in the characteristic impedance to be suppressed.

In FIG. 7A and FIG. 7B, the signal line 106 is coated with a photo solder resist 116. By coating the signal line 106 with a photo solder resist 116 in this manner, the electromagnetic field generated by the signal line 106 can be confined within the photo solder resist 116. Furthermore, when the signal line circuit device 102 is mounted on the mounting substrate 120, the space between the signal line 106 and the mounting substrate 120 can be further widened, meaning the effect of the mounting substrate 120 can be further reduced. The relative dielectric constant of the photo solder resist 116 can be set to 2.9, for example. The relative dielectric constant of the dielectric layer 104 is 4.4, for example. By coating the signal line 106 with an insulating material in this manner, the electromagnetic field generated by the signal line 106 when mounted is not simply released directly into the air, but rather, is effectively confined. By coating the signal line 106 with a material with a lower dielectric constant than the dielectric layer 104, the effect of the material on the characteristics of the signal line circuit device 102 can be reduced while retaining the confinement effect described above.

In FIG. 8A and FIG. 8B, the dielectric layer 104 is laminated on top of an insulating layer 134, and the signal line 106 is provided within a region in which the insulating layer 134 has been partially removed. The insulating layer 134 can be formed from the same material as the dielectric layer 104. This type of structure means that when the signal line circuit device 102 is mounted onto the mounting substrate 120, the space between the signal line 106 and the mounting substrate 120 can be further widened, enabling the effect of the mounting substrate 120 to be further reduced.

FIGS. 9A to 9E are a series of process cross-sectional views showing the stein producing the signal line circuit device 102 shown in FIG. 6A.

Figure 9A:
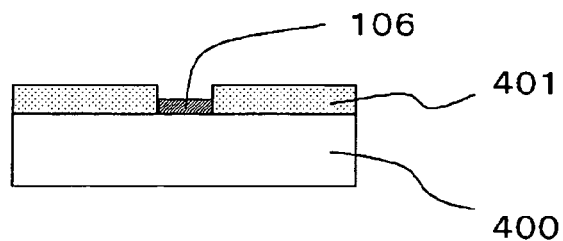
FIGS. 9A, 9B, 9C, 9D and 9E are diagrams showing a series of process cross-sectional views showing the stein producing the signal line circuit device shown in FIG. 6A.
Figure 9B:
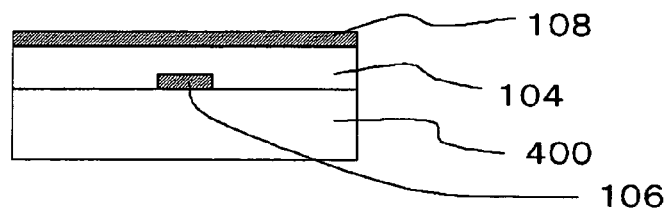
Figure 9C:
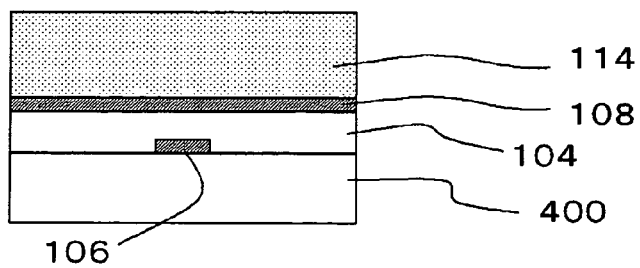

First, as shown in FIG. 9A, a photoresist 401 is formed on top of a sheet of metallic foil 400, and the metallic foil 400 is exposed in the area in which the signal line 106 is to be formed. Electroplating or the like is then used to form the signal line 106 on the exposed surface of the metallic foil 400. Subsequently, as shown in FIG. 9B, a dielectric layer 104 with a ground line 108 formed on the upper surface thereof is bonded on top of the signal line 106. Circuit elements and the like are then positioned on top of a wiring pattern, which although not shown in the diagrams is formed at the same time as the ground line 108, and these circuit elements are then sealed with a molded resin 114 (FIG. 9C).

Figure 9D:
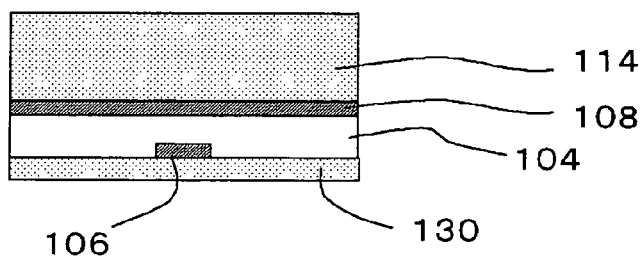
Figure 9E:
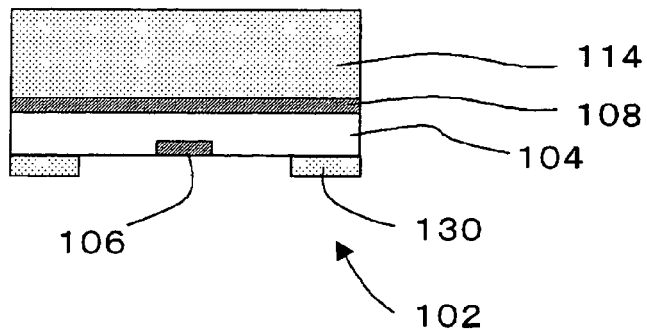

The metallic foil 400 is then removed be polishing, grinding, etching, or laser metal evaporation or the like, and a photo solder resist 130 is formed on the surface from which the metallic foil 400 has been removed (FIG. 9D). By subsequently patterning the photo solder resist 130 to form a predetermined shape, a signal line circuit device 102 with the structure shown in FIG. 6A is obtained (FIG. 9E).

FIGS. 10A to 10E are a series of process cross-sectional views showing the stein producing the signal line circuit device 102 shown in FIG. 8A.

Figure 10A:
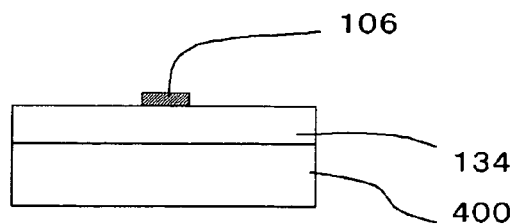
FIGS. 10A, 10B, 10C, 10D and 10E are diagrams showing a series of process cross-sectional views showing the stein producing the signal line circuit device shown in FIG. 8A.
Figure 10B:
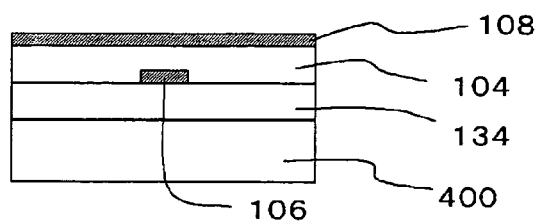
Figure 10C:
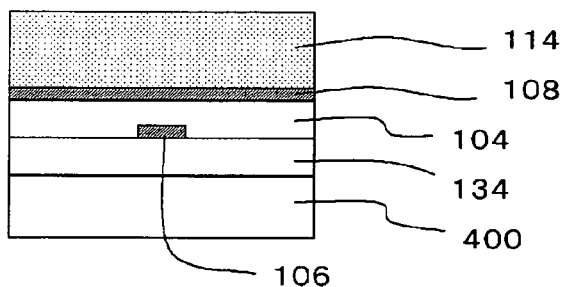

First, in a similar manner to that described above for FIG. 9A, a photoresist is formed on top of a sheet of metallic foil 400, the metallic foil 400 is exposed within predetermined areas, and a wiring pattern (not shown in the diagrams) is formed. An insulating layer 134 with a conductive foil formed thereon is then formed on top of the metallic foil 400. Subsequently, etching is used to pattern the conductive foil, thus forming a signal line 106 on top of the insulating layer 134 (FIG. 10A). Subsequently, a dielectric layer 104 with a ground line 108 formed on the upper surface thereof is bonded on top of the signal line 106 (FIG. 10B). The insulating layer 134 and the dielectric layer 104 can be formed from the same material. Circuit elements and the like are then positioned on top of the wiring pattern, which although not shown in the diagrams is formed at the same time as the ground line 108, and these circuit elements are then sealed with a molded resin 114 (FIG. 10C).

Figure 10D:
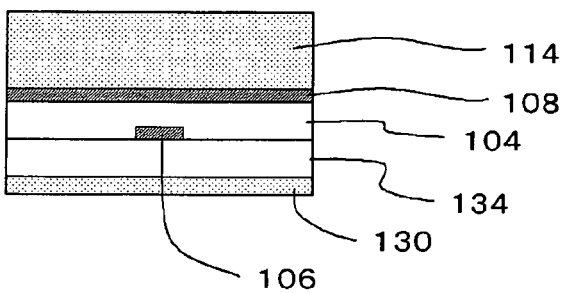
Figure 10E:
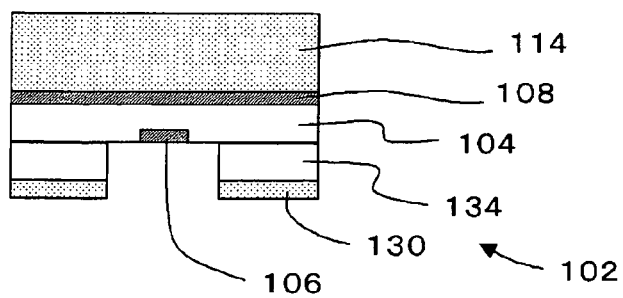

The metallic foil 400 is then removed, and a photo solder resist 130 is formed on the surface from which the metallic foil 400 has been removed (FIG. 10D). A concave portion is then formed by selectively removing sections of the photo solder resist 130 and the insulating layer 134. This completes the production of a signal line circuit device 102 with the structure shown in FIG. 8A. Removal of the photo solder resist 130 and the insulating layer 134 can be conducted using drilling, laser processing, or a combination of these two methods.

In the production steps described above, because the metallic foil 400 functions as a support substrate until it is removed, the signal line circuit device 102 can be produced with good moldability, even if the dielectric layer 104 is very thin. Consequently, the dielectric layer 104 can be formed with minimal thickness, thus enabling the width of the signal line 106 to be kept narrow. As a result, the effect of the mounting substrate 120 can be significantly reduced, even if the signal line 106 is provided on the exterior of the signal line circuit device 102.

Examples of suitable materials for the dielectric layer 104 include epoxy resins, melamine derivatives such as BT resin, liquid crystal polymers, PPE resins, polyimide resins, fluororesins, phenol resins, and polyamidebismaleimide resins.

Specific examples of suitable epoxy resins include bisphenol A resin, bisphenol F resin, bisphenol S resin, phenol novolac resin, cresol novolac epoxy resin, trisphenolmethane epoxy resin, and alicyclic epoxy resin.

Specific examples of suitable melamine derivatives include melamine, melamine derivatives such as melamine cyanurate, methylolated melamine, melam, melem, melon, succinoguamine, melamine sulfate, acetoguanamine sulfate, melam sulfate, guanylmelamine sulfate, melamine resin, BT resin, cyanuric acid, isocyanuric acid, isocyanuric acid derivatives, melamine isocyanurate, benzoguanamine, and acetoguanamine, as well as guanidine based compounds and the like.

Specific examples of suitable liquid crystal polymers include aromatic liquid crystal polyesters, polyimides, and polyesteramides, as well as resin compositions containing such polymers. Of these, liquid crystal polyesters or compositions comprising liquid crystal polyesters are preferred as they provide superior balance between the heat resistance, the workability, and the hygroscopicity.

The above description focused on a specific embodiment of the present invention. However, this embodiment is merely exemplary of the invention and is not to be considered as limiting. It should be understood to a person skilled in the art that various modifications can be made without departing from the scope of the present invention.

In the embodiment described above, the signal line circuit device 102 was used for adjusting the characteristics of an amplification circuit, but the signal line circuit device 102 can also be used as an oscillator, a resonator, or a band pass filter or the like.

Figure 11:
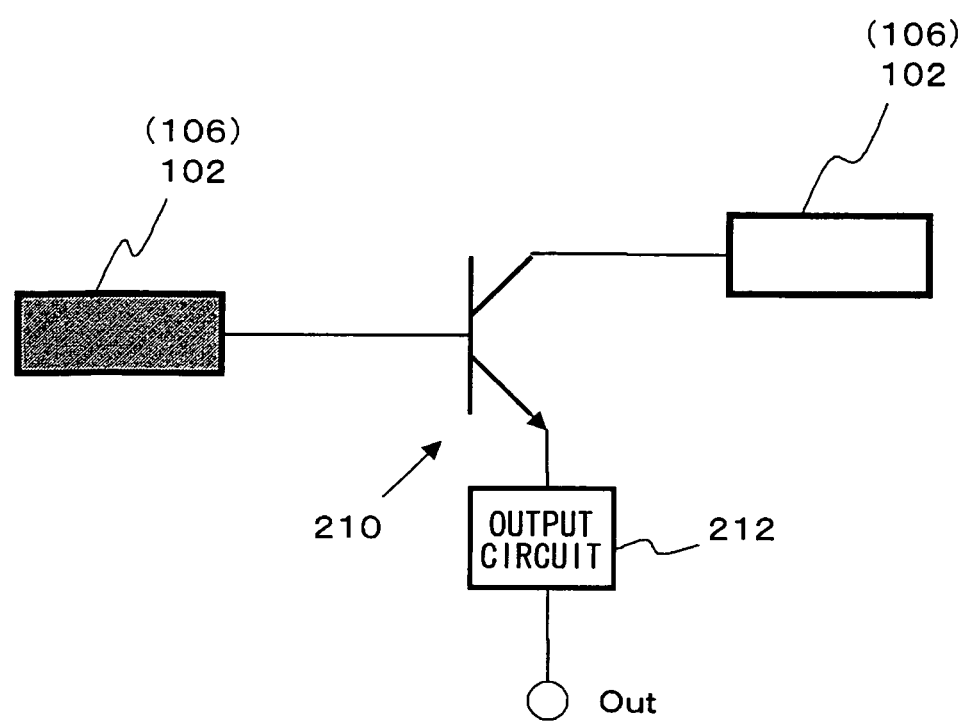
FIG. 11 is a diagram showing the layout of the peripheral circuits when a signal line circuit device according to the first embodiment of the present invention is used as an oscillator.

FIG. 11 is a diagram showing the layout of the peripheral circuits when a signal line circuit device 102 is used in an oscillator. The signal line circuit device 102 is provided at the base and/or the collector of a transistor 210, and the oscillating frequency can be altered by adjusting the length of the signal line 106.

Figure 12:
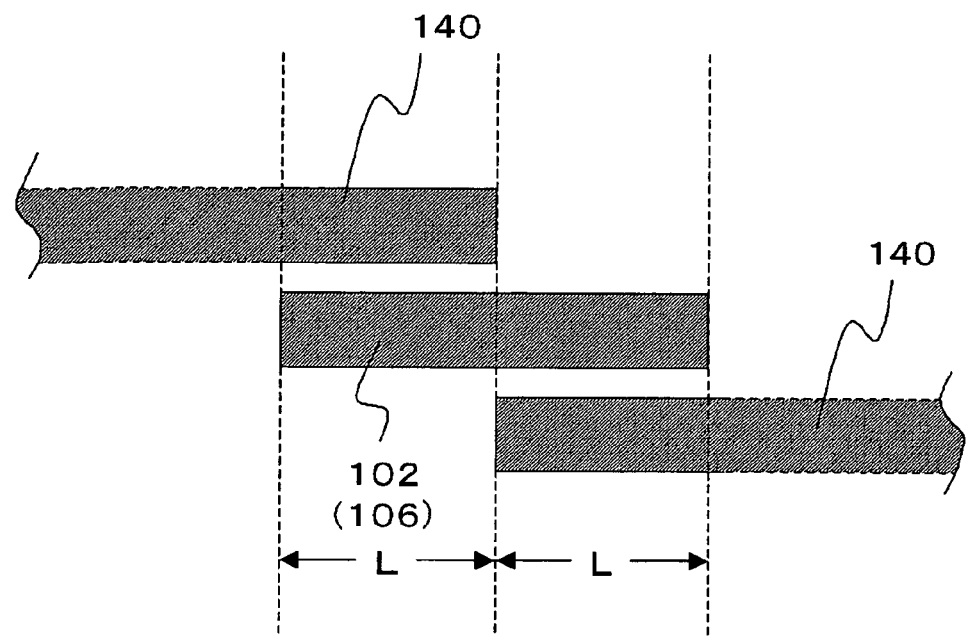
FIG. 12 is a diagram showing an example in which a signal line circuit device according to the first embodiment of the present invention is used in a band pass filter.

FIG. 12 is a diagram showing an example where a signal line circuit device 102 is used in a band pass filter. In this case, other signal lines 140 are provided in parallel at both ends of the signal line 106 of the signal line circuit device 102. By trimming the signal lines and altering the length L of region in which the signal line transmission paths overlap, the center frequency of the band pass filter can be adjusted.

Conventional Technology of the Second Embodiment

Figure 20:
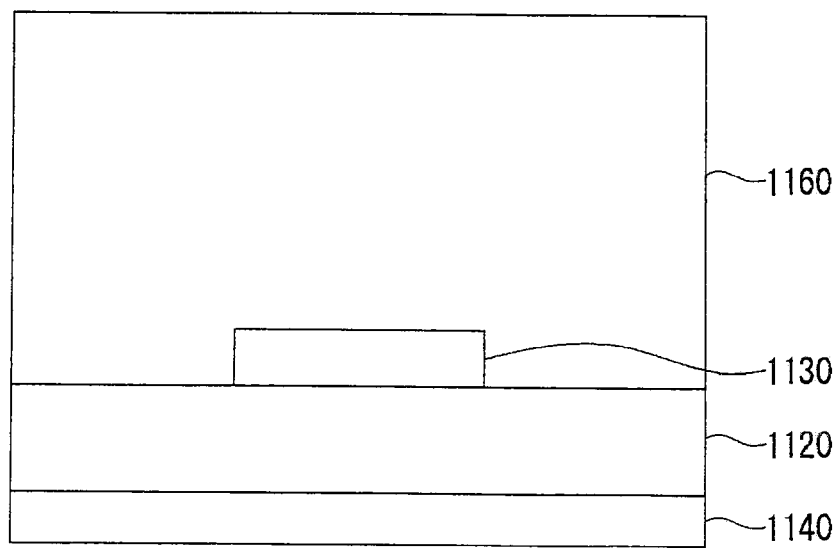
FIG. 20 is a diagram showing a conventional example with a line that has been wired for transmitting a high frequency signal.

FIG. 20 is a diagram showing a conventional example with a line that has been wired for transmitting a high frequency signal. In this example, a signal line 1130 is formed on the upper surface of a dielectric substrate 1120, and a ground conductor 1140 is formed on the lower surface of the dielectric substrate 1120. Furthermore, although not shown in the diagram, circuit elements such as semiconductor elements or passive elements are disposed on the surface of the dielectric substrate 1120, and these circuit elements are covered with a sealing layer 1160.

It is already known that by using a material with a low water absorption for the entire dielectric substrate in order to reduce the transmission loss in this type of wiring board, the dielectric loss can be reduced (see Japanese Patent Laid-Open Publication No. Hei 11-121934).

However, the unit cost of materials with a low water absorption is high, meaning that if the water absorption for the entire dielectric substrate is reduced, the associated material costs increase, resulting in an increase in the overall production costs.

SECOND EMBODIMENT

One aspect of a second embodiment of the present invention is a wiring board in which a signal line is formed on one surface of a dielectric substrate and a ground conductor is formed on the other surface, wherein the wiring board also comprises a coating layer which covers the signal line and a sealing layer which seals the signal line, and wherein the dielectric substrate is formed from a resin material, and the dielectric loss tangent for the coating layer is smaller than that for the sealing layer.

By adopting such a structure, the electromagnetic field of the signal line is confined within the coating layer, meaning the strength of the electromagnetic field that leaks out into the sealing layer, or even outside the wiring board, is reduced. As a result, the electrostatic capacity of the sealing layer is reduced, enabling suppression of the dielectric loss that occurs within the sealing layer, and suppression of the radiation loss. Furthermore, because a material with a comparatively large dielectric loss tangent can be used for the sealing layer, production costs can be reduced.

Another aspect of the second embodiment of the present invention also provides a wiring board in which a signal line is formed on one surface of a dielectric substrate and a ground conductor is provided close to at least one side of the signal line, wherein the wiring board also comprises a coating layer which covers the signal line and a sealing layer which seals the signal line, and wherein the dielectric substrate is formed from a resin material, and the dielectric loss tangent for the coating layer is smaller than that for the sealing layer.

By adopting such a structure, the electromagnetic field of the signal line is confined within the coating layer, meaning the strength of the electromagnetic field that leaks out into the sealing layer, or even outside the wiring board, is reduced. As a result, the dielectric loss that occurs within the sealing layer is suppressed, as is the radiation loss. Furthermore, because a material with a comparatively large dielectric loss tangent can be used for the sealing layer, production costs can be reduced.

In both of the above structures, from the viewpoint of increasing the electromagnetic field confinement effect of the coating layer, the relative dielectric constant of the coating layer may be equal to, or greater than, that of the sealing layer.

Furthermore, in both of the above structures, the dielectric loss tangent for the coating layer is preferably no more than one tenth of that for the sealing layer. By adopting such a configuration, the favorable electromagnetic field confinement effect provided by the coating layer ensures a marked reduction in the transmission loss, meaning a low cost material can be used for the sealing layer, thus effectively reducing the production costs for the wiring board.

Detailed Description of the Second Embodiment

Figure 15:
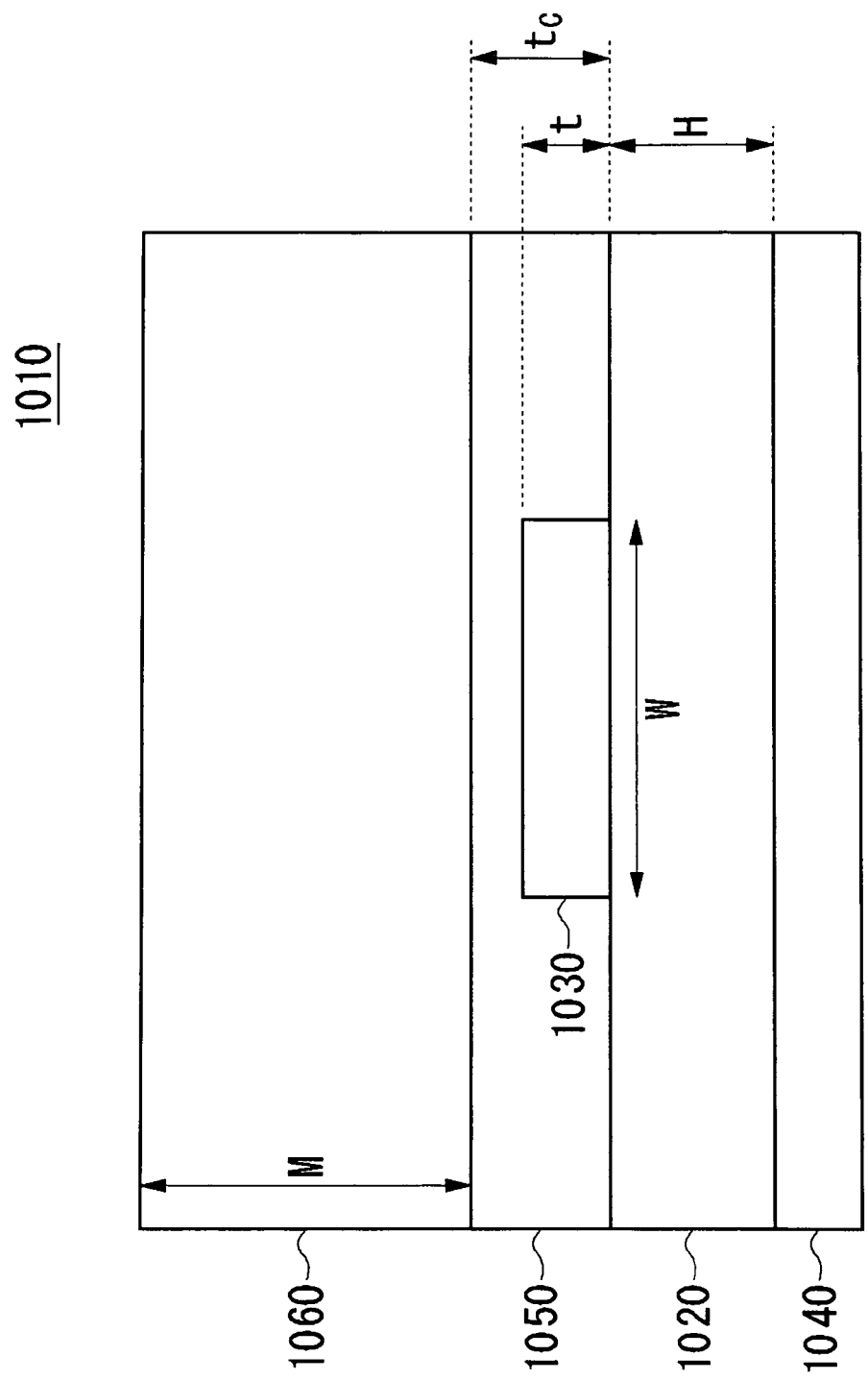
FIG. 15 is a cross-sectional view showing a high frequency wiring board according to a second embodiment of the present invention.

FIG. 15 is a cross-sectional view showing a high frequency wiring board 1010 according to the second embodiment. The high frequency wiring board 1010 comprises a dielectric substrate 1020, a signal line 1030 formed on one surface of the dielectric substrate 1020, a ground conductor 1040 formed on the other surface of the dielectric substrate 1020, a coating layer 1050 which covers the signal line 1030, and a sealing layer 1060 for sealing the coated signal line 1030 and the coating layer 1050. Accordingly, in the high frequency wiring board 1010, the coating layer 1050 is provided between the signal line 1030 and the sealing layer 1060. The coating layer 1050 uses a material with a smaller dielectric loss tangent than that of the sealing layer 1060.

The dielectric substrate 1020 is a substrate formed from a resin material. Examples of suitable materials for this resin material include epoxy resins, melamine derivatives such as BT resin, liquid crystal polymers, PPE resins, polyimide resins, fluororesins, phenol resins, and polyamidebismaleimide resins.

Specific examples of suitable epoxy resins include bisphenol A resin, bisphenol F resin, bisphenol S resin, phenol novolac resin, cresol novolac epoxy resin, trisphenolmethane epoxy resin, and alicyclic epoxy resin.

Specific examples of suitable melamine derivatives include melamine, melamine derivatives such as melamine cyanurate, methylolated melamine, melam, melem, melon, succinoguamine, melamine sulfate, acetoguanamine sulfate, melam sulfate, guanylmelamine sulfate, melamine resin, BT resin, cyanuric acid, isocyanuric acid, isocyanuric acid derivatives, melamine isocyanurate, benzoguanamine, and acetoguanamine, as well as guanidine based compounds and the like.

Specific examples of suitable liquid crystal polymers include aromatic liquid crystal polyesters, polyimides, and polyesteramides, as well as resin compositions containing such polymers. Of these, liquid crystal polyesters or compositions comprising liquid crystal polyesters are preferred as they provide superior balance between the heat resistance, the workability, and the hygroscopicity.

Examples of suitable materials for the coating layer 1050 include resins such as epoxy resins, acrylic resins, urethane resins, and polyimide resins, mixtures of these resins, as well as mixtures comprising one or more of the above resins and one or more inorganic fillers such as carbon black, alumina, aluminum nitride, boron nitride, tin oxide, iron oxide, copper oxide, talc, mica, kaolinite, calcium oxide, silica, and titanium oxide.

Epoxy resins are ideal materials for the sealing layer 1060.

Although not shown in the diagram, circuit elements such as semiconductor elements or passive elements are disposed on the same side of the dielectric substrate 1020 as the signal line 1030. Examples of possible semiconductor elements include transistors, diodes, and IC chips, whereas examples of possible passive elements include chip capacitors and chip resistors. Furthermore, although not shown in the diagrams, a wiring pattern is also formed on top of the dielectric substrate 1020, and is connected electrically to the circuit elements. The sealing layer 1060 also seals these circuit elements.

Figure 16:
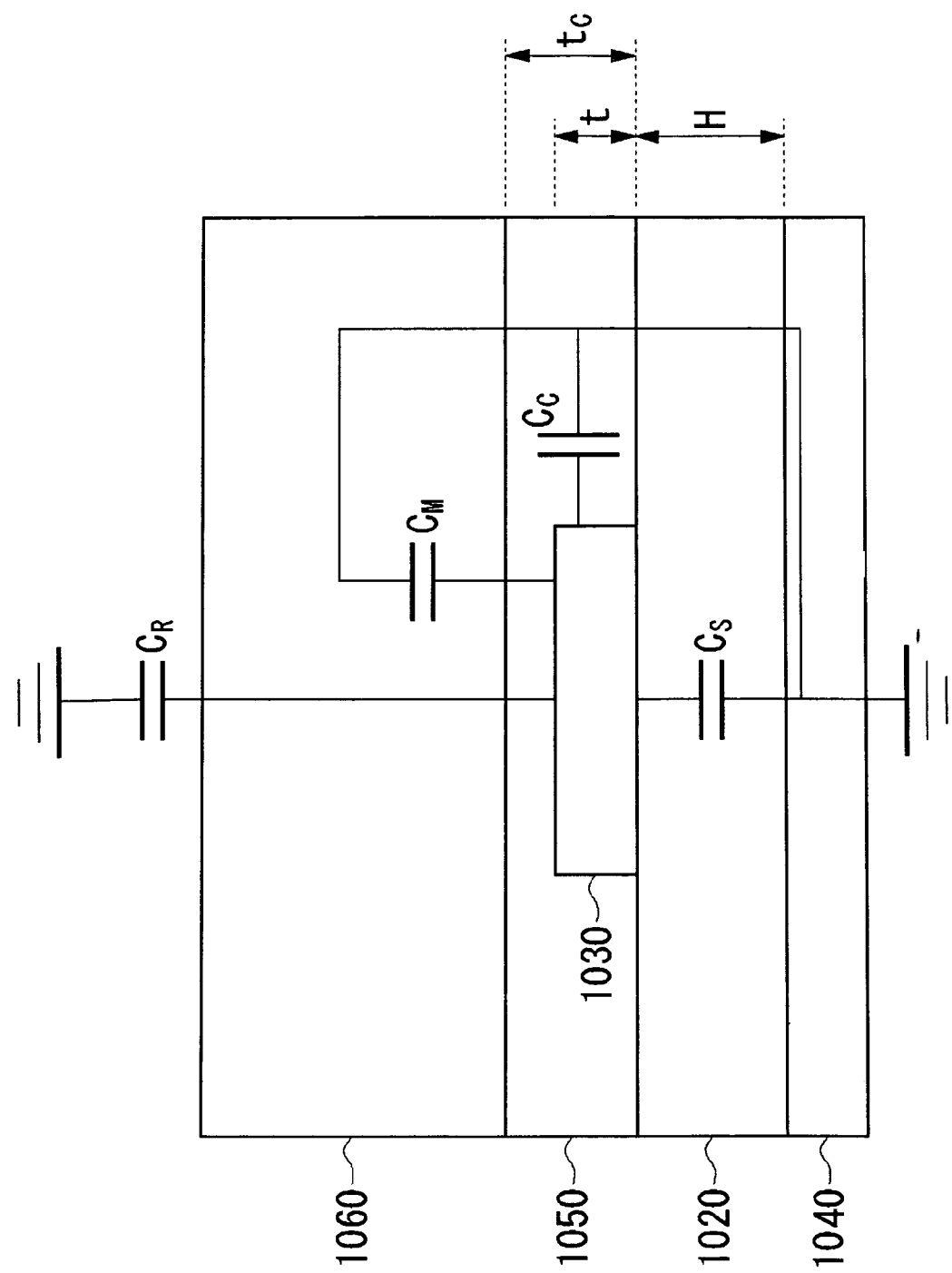
FIG. 16 is a diagram showing an equivalent circuit in a cross-section through the high frequency wiring board.

As follows is a description of the theory relating to the reduction in the transmission loss provided by this embodiment. FIG. 16 is a diagram showing an equivalent circuit in a cross-section through the high frequency wiring board 1010 provided by the microstrip line. In the equivalent circuit shown in FIG. 16, capacitances $C_C$, $C_M$, $C_S$, and $C_R$ per unit line length, generated via the coating layer 1050, the sealing layer 1060, the dielectric substrate 1020, and the air outside the high frequency wiring board 1010 respectively, are connected in parallel between the signal line 1030 and the ground conductor 1040. The total capacitance $C_T$ of a line with this circuit configuration can be represented by the formula (1), shown below.

$$C_T = C_S + C_C + C_M + C_R \qquad (1)$$

Using the total capacitance $C_T$ described above, the characteristic impedance ($Z_0$) of the line can be represented by the formula (2), shown below. The symbol L is the inductance per unit line length, which is determined by the cross-sectional shape of the signal line 1030.

$$Z_0 = \sqrt{\frac{L}{C_T}} \qquad (2)$$

Under conditions where the characteristic impedance of the line is constant, namely, under conditions where $C_T$ and L are constant, by providing a coating layer 1050 with a more favorable dielectric loss tangent than the sealing layer 1060 between the signal line 1030 and the sealing layer 1060, the contribution of $C_M$ to $C_T$, namely $C_M/C_T$, and the contribution of $C_R$ to $C_T$, namely $C_R/C_T$ are reduced, meaning both the electromagnetic field distributed within the sealing layer 1060 and the electromagnetic field radiated into the air outside the high frequency wiring board 1010 can be reduced. This enables reductions in both the dielectric loss and the radiation loss generated within the sealing layer 1060.

When a coating layer 1050 is provided, a certain size electromagnetic field is also generated in the coating layer 1050. However, because the coating layer 1050 is formed from a material with a favorable dielectric loss tangent, the effect of any dielectric loss within the coating layer 1050 is minimal.

In this manner, by providing a coating layer 1050 with a more favorable dielectric loss tangent than that of the sealing layer 1060, the electromagnetic field is confined within the coating layer 1050, and the size of the electromagnetic field that leaks into the sealing layer 1060 is reduced. As a result, both the dielectric loss within the sealing layer 1060, which typically displays a large dielectric loss, and the radiation loss outside the circuit device are reduced, while by suppressing the dielectric loss in the coating layer 1050, the transmission loss of the entire line can be reduced.

According to the theory outlined above, increasing the relative dielectric constant of the coating layer 1050 enables the proportion of the total capacitance provided by the coating layer 1050 to also be increased, thus enabling transmission loss to be effectively reduced.

(First Evaluation)

A device provided with a coating layer 1050 was compared with a device without a coating layer 1050, and the transmission loss reduction effect provided by the coating layer 1050 was evaluated.

EXAMPLE 1

The example 1 used the layer structure shown in FIG. 15, wherein the line width W of the signal line 1030 was 180 μm, and the line conductor thickness t was 25 μm. The dielectric substrate 1020 was formed from a liquid crystal polymer, with a relative dielectric constant of 2.85, a dielectric loss tangent of 0.0025, and a thickness H of 100 μm. The coating layer 1050 was formed from a polyimide, with a relative dielectric constant of 3.9, a dielectric loss tangent of 0.0036, and a thickness tc of 40 μm. The sealing layer 1060 was formed from an epoxy resin, with a relative dielectric constant of 3.6, a dielectric loss tangent of 0.006, and a thickness of 650 μm. Hence, in this example 1, the dielectric loss tangent of the coating layer 1050 was smaller than the dielectric loss tangent of the sealing layer 1060. Furthermore, the relative dielectric constant of the coating layer 1050 was larger than the relative dielectric constant of the sealing layer 1060.

COMPARATIVE EXAMPLE 1

With the exception of excluding the coating layer 1050, a comparative example 1 was prepared with the same structure as the example 1.

EXAMPLE 2

With the exception of altering the dielectric loss tangent of the sealing layer 1060 to 0.06, an example 2 was prepared with the same structure as the example 1.

COMPARATIVE EXAMPLE 2

With the exception of excluding the coating layer 1050, a comparative example 2 was prepared with the same structure as the example 2.

Table 1 summarizes the cross-sectional dimensions of, and the materials used in, the layered structures of the examples 1 and 2, and the comparative examples 1 and 2.

TABLE 1

| | SIGNAL LINE | | DIELECTRIC SUBSTRATE LAYER[S] | | | |
|---|---|---|---|---|---|---|
| | LINE WIDTH[W] (μm) | LINE CONDUCTOR THICKNESS[t] (μm) | MATERIAL | RELATIVE DIELECTRIC CONSTANT | DIELECTRIC LOSS TANGENT | THICKNESS [H] (μm) |
| EXAMPLE 1 | 180 | 25 | LIQUID CRYSTAL POLYMER | 2.85 | 0.0025 | 100 |
| COMPARATIVE EXAMPLE 1 | 180 | 25 | LIQUID CRYSTAL POLYMER | 2.85 | 0.0025 | 100 |
| EXAMPLE 2 | 180 | 25 | LIQUID CRYSTAL POLYMER | 2.85 | 0.0025 | 100 |
| COMPARATIVE EXAMPLE 2 | 180 | 25 | LIQUID CRYSTAL POLYMER | 2.85 | 0.0025 | 100 |

| | COATING LAYER | | | | SEALING LAYER | | | |
|---|---|---|---|---|---|---|---|---|
| | MATERIAL | RELATIVE DIELECTRIC CONSTANT | DIELECTRIC LOSS TANGENT | THICKNESS [tc] (μm) | MATERIAL | RELATIVE DIELECTRIC CONSTANT | DIELECTRIC LOSS TANGENT | THICKNESS [M] (μm) |
| EXAMPLE 1 | POLYIMIDE | 3.9 | 0.0036 | 40 | EPOXY RESIN | 3.6 | 0.006 | 650 |
| COMPARATIVE EXAMPLE 1 | NONE | — | — | — | EPOXY RESIN | 3.6 | 0.006 | 650 |
| EXAMPLE 2 | POLYIMIDE | 3.9 | 0.0036 | 40 | EPOXY RESIN | 3.6 | 0.06 | 650 |
| COMPARATIVE EXAMPLE 2 | NONE | — | — | — | EPOXY RESIN | 3.6 | 0.06 | 650 |

TABLE 2

| | CHARACTERISTIC IMPEDANCE [Z0] (Ω) | EFFECTIVE RELATIVE DIELECTRIC CONSTANT | TRANSMISSION LOSS (dB/cm) |
|---|---|---|---|
| EXAMPLE 1 | 49.0 | 3.20 | 0.090 |
| COMPARATIVE EXAMPLE 1 | 49.5 | 3.16 | 0.110 |
| EXAMPLE 2 | 49.0 | 3.20 | 0.309 |
| COMPARATIVE EXAMPLE 2 | 49.5 | 3.16 | 0.454 |

(First Evaluation Results)

Using an electromagnetic field simulation, the transmission loss at a frequency of 10 GHz was determined for each of the layered structures prepared in the examples 1 and 2, and the comparative examples 1 and 2. Table 2 shows the transmission loss for the examples 1 and 2, and the comparative examples 1 and 2. Comparing the results of the example 1 with those of the comparative example 1, it is evident that the transmission loss in the example 1 is approximately 0.02 dB/cm lower than that in the comparative example 1. The reduction in the transmission loss in the example 1, relative to that observed in the comparative example 1, is approximately 18%. Comparing the results of the example 2 with those of the comparative example 2, it is evident that the transmission loss in the example 2 is approximately 0.15 dB/cm lower than that in the comparative example 2. The reduction in the transmission loss in the example 2, relative to that observed in the comparative example 2 is approximately 32%.

These results confirm that providing a coating layer 1050 between the signal line 1030 and the sealing layer 1060 produces an improvement in the transmission loss characteristics. From the results of the example 2 and the comparative example 2 it is evident that the degree of reduction in the transmission loss is particularly large in those cases where the dielectric loss tangent of the sealing layer 1060 is not particularly favorable. Accordingly, even in those cases where a material with an unfavorable dielectric loss tangent is used for the sealing layer 1060, by providing a coating layer 1050 between the signal line 1030 and the sealing layer 1060, the transmission loss can still be suppressed, and because the unit cost of the sealing layer 1060 can be lowered, the overall production costs can be reduced.

Table 2 also shows results for the characteristic impedance and the effective relative dielectric constant, and it is clear that these characteristics for the examples 1 and 2 are substantially the same as those for the comparative examples 1 and 2.

(Second Evaluation)

In a second evaluation, a plurality of layered structures with different combinations of the thickness H of the dielectric substrate 1020 and the dielectric loss tangent of the sealing layer 1060 were prepared, and the effect on the transmission loss of changing the thickness tc of the coating layer 1050 was then investigated, enabling an evaluation of the relationship between the thickness tc of the coating layer 1050 and the transmission loss.

EXAMPLE 3

With the exceptions of altering the thickness H of the dielectric substrate 1020 to 50 μm, and setting the thickness tc of the coating layer 1050 to 25 μm, 50 μm, 100 μm, 150 μm, and 200 μm respectively, examples 3 were prepared with the same layered structure as the example 1.

EXAMPLE 4

With the exceptions of altering the thickness H of the dielectric substrate 1020 to 50 μm, and setting the thickness tc of the coating layer 1050 to 25 μm, 50 μm, 100 μm, 150 82 m, and 200 μm respectively, examples 4 were prepared with the same layered structure as the example 2.

EXAMPLE 5

With the exceptions of setting the thickness H of the dielectric substrate 1020 to 100 μm, and setting the thickness tc of the coating layer 1050 to 25 μm, 50 μm, 100 μm, 150 μm, and 200 μm respectively, examples 5 were prepared with the same layered structure as the example 1.

EXAMPLE 6

With the exceptions of setting the thickness H of the dielectric substrate 1020 to 100 μm, and setting the thickness tc of the coating layer 1050 to 25 μm, 50 μm, 100 μm, 150 μm, and 200 μm respectively, examples 6 were prepared with the same layered structure as the example 2.

EXAMPLE 7

With the exceptions of altering the thickness H of the dielectric substrate 1020 to 300 μm, and setting the thickness tc of the coating layer 1050 to 25 μm, 50 μm, 100 μm, 150 μm, and 200 μm respectively, examples 7 were prepared with the same layered structure as the example 1.

EXAMPLE 8

With the exceptions of setting the thickness H of the dielectric substrate 1020 to 300 μm, and setting the thickness tc of the coating layer 1050 to 25 μm, 50 μm, 100 μm, 150 μm, and 200 μm respectively, examples 8 were prepared with the same layered structure as the example 2.

In order to ensure a constant characteristic impedance, the line width W of the signal line 1030 in the above examples was varied in accordance with the thickness H of the dielectric substrate 1020, so that for the thickness H values of 50 μm, 100 μm and 300 μm, the line width W was set to 80 μm, 180 μm, and 500 μm respectively. Table 3 summarizes the cross-sectional dimensions of, and the materials used in, the layered structures of the examples 3 through 8.

TABLE 3

| | SIGNAL LINE | | DIELECTRIC SUBSTRATE LAYER[S] | | |
|---|---|---|---|---|---|
| | LINE CONDUCTOR | | | | |
| | LINE WIDTH[W] (μm) | THICKNESS[t] (μm) | MATERIAL | RELATIVE DIELECTRIC CONSTANT | DIELECTRIC LOSS TANGENT | THICKNESS[H] (μm) |
| EXAMPLE 3 | 80 | 25 | LIQUID CRYSTAL POLYMER | 2.85 | 0.0025 | 50 |
| EXAMPLE 4 | 80 | 25 | LIQUID CRYSTAL POLYMER | 2.85 | 0.0025 | 50 |
| EXAMPLE 5 | 180 | 25 | LIQUID CRYSTAL POLYMER | 2.85 | 0.0025 | 100 |
| EXAMPLE 6 | 180 | 25 | LIQUID CRYSTAL POLYMER | 2.85 | 0.0025 | 100 |
| EXAMPLE 7 | 500 | 25 | LIQUID CRYSTAL POLYMER | 2.85 | 0.0025 | 300 |
| EXAMPLE 8 | 500 | 25 | LIQUID CRYSTAL POLYMER | 2.85 | 0.0025 | 300 |

| | COATING LAYER | | | | SEALING LAYER | | | |
|---|---|---|---|---|---|---|---|---|
| | MATERIAL | RELATIVE DIELECTRIC CONSTANT | DIELECTRIC LOSS TANGENT | THICKNESS [tc] (μm) | MATERIAL | RELATIVE DIELECTRIC CONSTANT | DIELECTRIC LOSS TANGENT | THICKNESS[M] (μm) |
| EXAMPLE 3 | POLYIMIDE | 3.9 | 0.0036 | 25~200 | EPOXY RESIN | 3.6 | 0.006 | 650 |
| EXAMPLE 4 | POLYIMIDE | 3.9 | 0.0036 | 25~200 | EPOXY RESIN | 3.6 | 0.06 | 650 |
| EXAMPLE 5 | POLYIMIDE | 3.9 | 0.0036 | 25~200 | EPOXY RESIN | 3.6 | 0.006 | 650 |
| EXAMPLE 6 | POLYIMIDE | 3.9 | 0.0036 | 25~200 | EPOXY RESIN | 3.6 | 0.06 | 650 |
| EXAMPLE 7 | POLYIMIDE | 3.9 | 0.0036 | 25~200 | EPOXY RESIN | 3.6 | 0.006 | 650 |
| EXAMPLE 8 | POLYIMIDE | 3.9 | 0.0036 | 25~200 | EPOXY RESIN | 3.6 | 0.06 | 650 |

(Second Evaluation Results)

Figure 17:
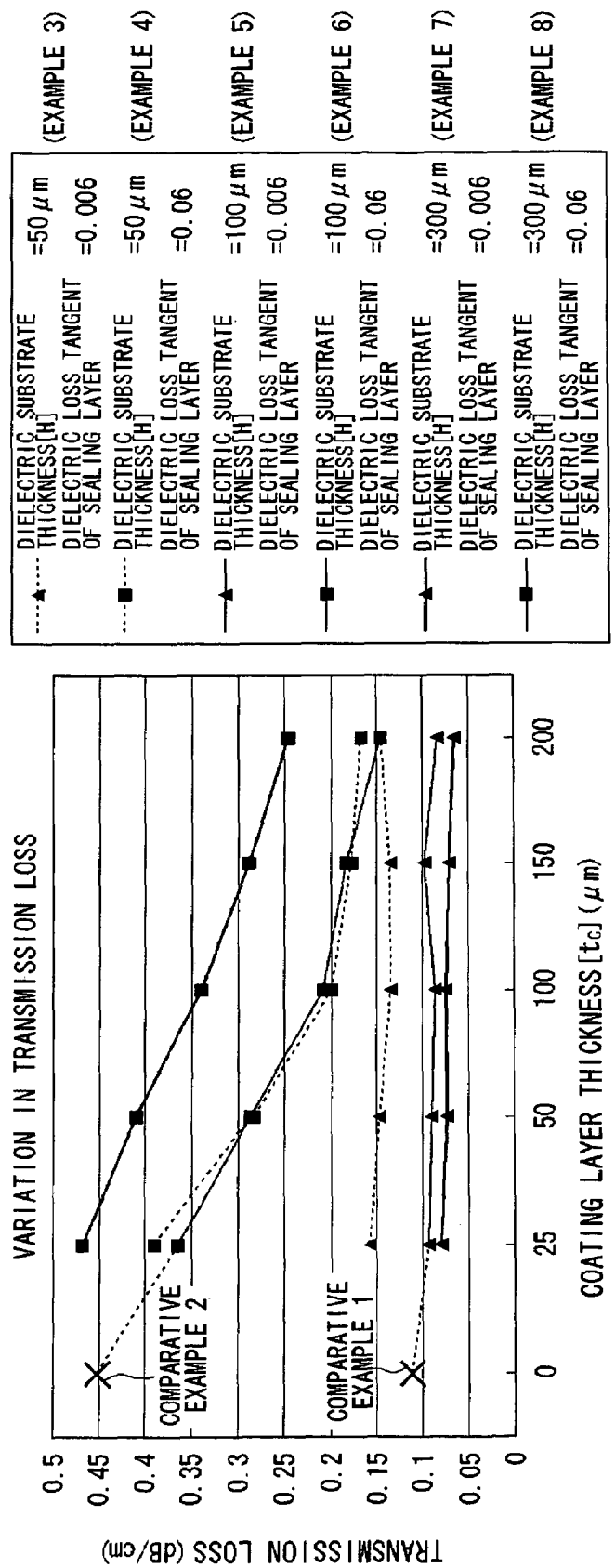
FIG. 17 is a graph showing the dependency of the transmission loss per unit line length on the coating layer thickness tc for examples 3 though 8.

FIG. 17 is a graph showing the dependency of the transmission loss per unit line length on the coating layer thickness tc for examples 3 through 8. In FIG. 17, for the purposes of comparison, the transmission loss values for the comparative examples 1 and 2 described above are indicated with × symbols. In the examples 4, 6, and 8, a strong dependency of the transmission loss on the coating layer thickness tc, in other words, a marked tendency for the transmission loss to decrease as the thickness increases, is confirmed. The dielectric loss tangent for the sealing layer 1060 in each of the examples 4, 6, and 8 is 0.06, whereas in the examples 3, 5, and 7, where the dependency of the transmission loss on the coating layer thickness tc is minimal, the dielectric loss tangent for the sealing layer 1060 is 0.006. These results confirmed that when a sealing layer 1060 with a poor dielectric loss tangent is used, the result of providing a coating layer 1050, and thus achieving a stronger manifestation of the capacitance reduction effect within the sealing layer 1060, is a greater reduction in the transmission loss. Generally, materials for the sealing layer 1060 with more favorable dielectric loss tangent values are more expensive, meaning that if a sealing layer 1060 with a comparatively poor dielectric loss tangent can be used, as in the manner described above, then the material costs can be reduced, enabling a reduction in the overall production costs. In order to effectively combine the type of reduction effect in the transmission loss shown in FIG. 17, provided by the existence of the coating layer 1050, with the reduction in material costs achieved by using a sealing layer 1060 with a comparatively poor dielectric loss tangent, the dielectric loss tangent of the coating layer 1050 should preferably be no more than one tenth of the dielectric loss tangent of the sealing layer 1060.

(Third Evaluation)

In a third evaluation, the frequency dependency of the transmission loss was investigated. A total of three samples were prepared, including one from the comparative example 2, and two from the example 6, with the coating layer thickness tc set to 100 μm and 200 μm respectively.

(Third Evaluation Results)

Figure 18:
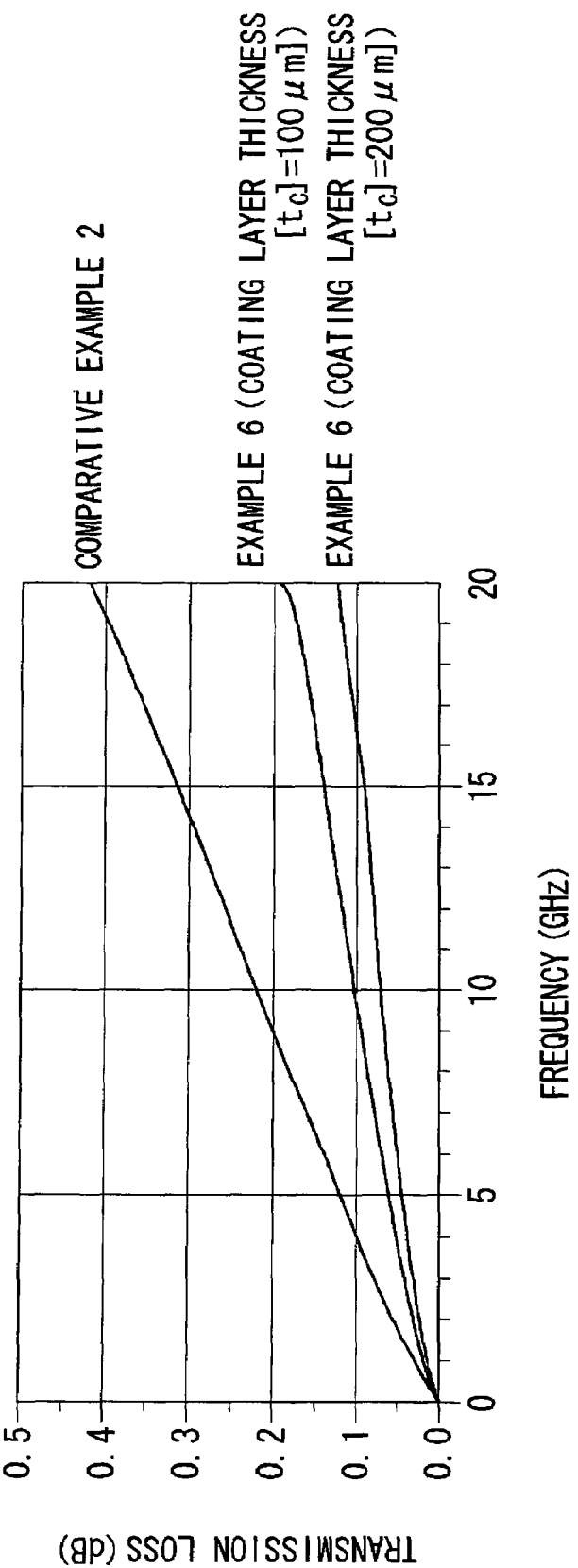
FIG. 18 is a graph showing the frequency dependency of the transmission loss (dB)

For each sample, the transmission loss was determined for a line length L of 5 mm, across a frequency range of 0 to 20 GHz. FIG. 18 is a graph showing the frequency dependency of the transmission loss (dB).

As shown in FIG. 18, in a case such as the comparative example 2, where no coating layer 1050 is provided, the transmission loss increases dramatically as the frequency increases. In contrast, in cases such as the samples of the example 6, where a coating layer 1050 is provided (with a coating layer thickness tc of 100 μm or 200 μm), the rate of increase in the transmission loss as the frequency increases is significantly lower than that observed for the case with no coating layer 1050, confirming that the transmission loss suppression effect provided by the existence of the coating layer 1050 becomes increasingly significant as the frequency increases.

The second embodiment of the invention is as described above. However, this embodiment is merely exemplary of the invention and is not to be considered as limiting. It should be understood to a person skilled in the art that various modifications can be made without departing from the scope of the present invention.

Figure 19:
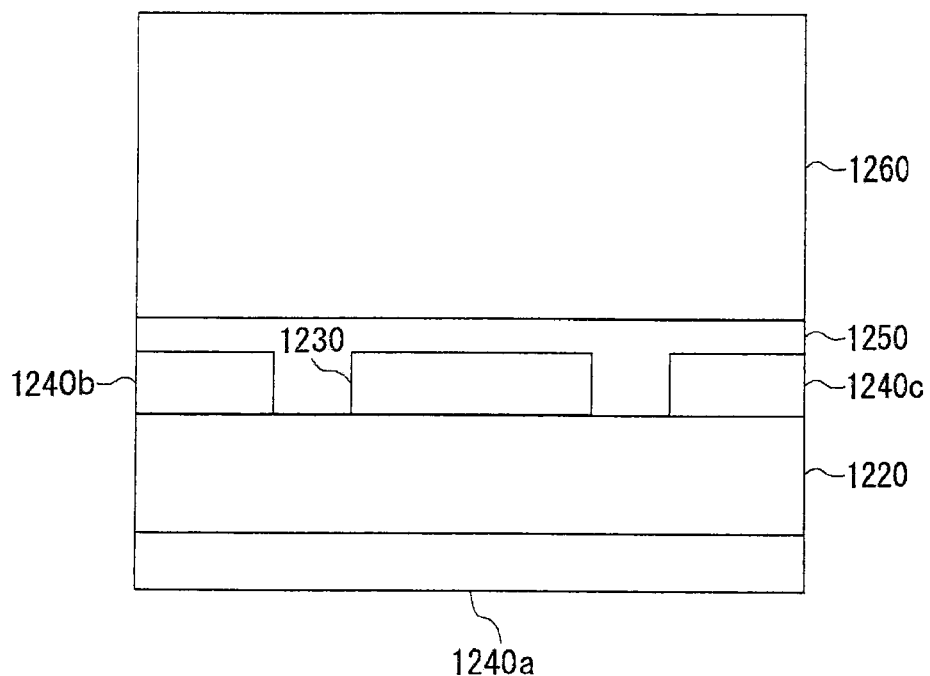
FIG. 19 is a cross-sectional view of a coplanar line with a coating layer.

For example, in a coplanar line shown in cross-section in FIG. 19, by providing a coating layer 1250 with a more favorable dielectric loss tangent than a sealing layer 1260 between a signal line 1230 and the sealing layer 1260, a reduction in the transmission loss can be achieved at very low cost. Furthermore, in the example shown in FIG. 19, a structure is shown in which ground conductors 1240*a*, 1240*b*, and 1240*c* are provided on both surfaces of a dielectric substrate 1220, but a structure without the ground conductor 1240*a* on the opposite surface of the dielectric substrate 1220 to the signal line 1230 is also suitable.

What is claimed is:

1. A signal line circuit device comprising:
   a substrate;
   a dielectric layer disposed over the substrate;
   a signal line on one surface of the dielectric layer;
   a spacer between the substrate and the dielectric layer to ensure a space between the signal line and the substrate;
   a conductive member on a surface of the substrate opposite the surface of the dielectric layer on which the signal line is disposed, the conductive member connected to a ground potential, and
   a wiring layer embedded in the dielectric layer, wherein the wiring layer overlaps the signal line and is connected to the ground potential,
   wherein the signal line is disposed such that the signal line and the conductive member do not overlap each other.

2. The signal line circuit device according to claim 1 wherein the signal line is covered by an insulating material having a dielectric constant lower than a dielectric constant of the material of the dielectric layer.

3. The signal line circuit device according to claim 1 further comprising:
   an external electrode electrically connected to the wiring layer by a via and formed on one surface of the dielectric layer; and
   a solder that bonds together the conductive member and the external electrode.

4. The signal line circuit device according to claim 1 further comprising another conductive member connected to the ground potential and disposed on a surface of the substrate other than the surface opposite the signal line.

* * * * *